US008488856B2

(12) United States Patent
Yui

(10) Patent No.: US 8,488,856 B2
(45) Date of Patent: Jul. 16, 2013

(54) MAGNETIC RESONANCE IMAGING APPARATUS AND METHOD OF ANALYZING IMAGES PROVIDED THEREBY

(75) Inventor: Masao Yui, Otawara (JP)

(73) Assignees: Kabushiki Kaisha Toshiba, Minato-Ku, Tokyo (JP); Toshiba Medical Systems Corporation, Otawara-Shi, Tochigi-Ken (JP)

( * ) Notice: Subject to any disclaimer, the term of this patent is extended or adjusted under 35 U.S.C. 154(b) by 1067 days.

(21) Appl. No.: 12/019,459

(22) Filed: Jan. 24, 2008

(65) Prior Publication Data

US 2008/0187180 A1 Aug. 7, 2008

(30) Foreign Application Priority Data

Feb. 6, 2007 (JP) ................................. 2007-027050
Dec. 19, 2007 (JP) ................................. 2007-327683

(51) Int. Cl.
    *G06K 9/30* (2006.01)
(52) U.S. Cl.
    USPC ............... 382/131; 382/128; 382/130; 600/9; 600/10; 600/13; 600/14; 700/19
(58) Field of Classification Search
    USPC .................. 382/128, 130, 131; 600/9, 10, 13, 600/14; 700/19
    See application file for complete search history.

(56) References Cited

U.S. PATENT DOCUMENTS

| 6,292,683 | B1 | 9/2001 | Gupta et al. | |
|---|---|---|---|---|
| 2002/0095085 | A1* | 7/2002 | Saranathan et al. | .......... 600/413 |
| 2002/0156366 | A1 | 10/2002 | Stainsby et al. | |
| 2006/0183999 | A1 | 8/2006 | Lorenz et al. | |
| 2007/0253609 | A1* | 11/2007 | Aben | ............................. 382/128 |

FOREIGN PATENT DOCUMENTS

| JP | 2004-509686 | 4/2004 |
|---|---|---|
| JP | 2005-278919 | 10/2005 |
| JP | 2006-509613 | 3/2006 |
| JP | 2006-198407 | 8/2006 |

OTHER PUBLICATIONS

Jahnke et al. "A New Approach for Rapid Assessment of the Cardiac Rest Period for Coronary MRA", Journal of Cardiovascular Magnetic Resonance (2005) 7, pp. 395-399.*
European Search Report dated Jun. 9, 2008 in EP 08 00 1254.
Nehrke K., et al., "Automatic selection of cardiac acquisition window using an image-based global cross-correlation of multi heart phase cine scans," Proceedings of the International Society for Magnetic Resonance in Medicine, 11$^{th}$ Scientific Meeting and Exhibition, Jul. 10-16, 2003, Toronto, Ontario, Canada, p. 1623, XP 002480163.

(Continued)

*Primary Examiner* — Nicole Ippolito
(74) *Attorney, Agent, or Firm* — Nixon & Vanderhye PC

(57) ABSTRACT

A magnetic resonance imaging apparatus includes a cine-imaging unit, a characterizing-part detecting unit, a motion-analyzing unit, and an image-extracting unit. First, the cine-imaging unit collects the time-series images of a region of interest in a subject and reconstructs an image. Next, the characterizing-part detecting unit detects the characteristics of the time-series images. The motion-analyzing unit analyzes motion-characteristic values of the characteristics extracted by the characterizing-part detecting unit. The image-extracting unit extracts a specified time-series image in accordance with the motion-characteristic values.

6 Claims, 6 Drawing Sheets

OTHER PUBLICATIONS

Jahnke C., et al., "A new approach for rapid assessment of the cardiac rest period for coronary MRA," Journal of Cardiovascular Magnetic Resonance, vol. 7, 2005, pp. 395-399, XP009100212.

Ustun AO, et al., "Automated identification of minimal myocardial motion for improved image quality in coronary MRA at 3T," Proceedings of the International Society for Magnetic Resonance in Medicine, 14th Scientific Meeting and Exhibition, May 6-12, 2006, Seattle, USA, May 6, 2006, p. 2150, XP002480164.

Bi, X, et al., "Optimal selection of the subject-specific data acquisition window for coronary MRA," Procdeedings of the International Society for Magnetic Resonance in Medicine, 14th Scientific Meeting and Exhibition, May 6-12, 2006, Seattle, USA, p. 2163, XP002480165.

Peters D.C., et al., "Single heart beat coronary artery imaging provides direct assessment of respiratory motion compensation methods," Proceedings of the International Society for Magnetic Resonance in Medicine, 13th Scientific Meeting and Exhibition, May 7-13, 2005, Miami Beach, USA, p. 1613, XP 002480166.

Saranathan, M., et al, "Automated mapping of vessel trajectories for improved tracking in coronary MR angiography," Proceedings of the International Society for Magnetic Resonance in Medicine, 8th Scientific Meeting and Exhibition, Apr. 1-7, 2000, Denver, Colorado, USA, p. 264, XP 002480167.

Ustun A., et al., "Automated identification of minimal myocardial motion for an improved image quality on MR angiography at 3 T," American Journal of Roentgenology, Mar. 1, 2007, pp. W283-W290, XP 002480168.

Bi, X. et al, "A fully automated selection of the optimal data acquisition window in coronary MRA eliminating the need for user-interaction," Proceedings of the International Society for Magnetic Resonance in Medicine, 15th Scientific Meeting and Exhibition, May 19-24, 2007, Berlin, Germany, p. 2488, XP 002480169.

Shea S.M., et al., "Optimization of coronary wall imaging," Proceedings of the International Society for Magnetic Resonance in Medicine, 15th Scientific Meeting and Exhibition, May 19-24, 2007, Berlin, Germany, p. 2475, XP 002480170.

Dewan, M., et al., "Image-based coronary tracking and beat-to-beat motion compensation for robust coronary MR angiography," Proceedings of the International Society for Magnetic Resonance in Medicine, 15th Scientific Meeting and Exhibition, May 19-24, 2007, Berlin, Germany, p. 3877, XP002480171.

Rasche V., et al., "Automatic extraction of the low-motion phases of the heart," Proceedings of the International Society for Magnetic Resonance in Medicine, 15th Scientific Meeting and Exhibition, May 19-24, 2007, Berlin, Germany, p. 2545, XP002480172.

Shechter Guy et al., "Rest period duration of the coronary arteries: Implications for magnetic resonance coronary angiography," Medical Physics, AIP, Melville, NY, U.S., vol. 32, No. 1, Jan. 3, 2005, pp. 255-262, XP012075144, ISSN: 0094-2405.

Hofman M.B.M., et al., "Quantification of in-plane motion of the coronary arteries during the cardiac cycle: Implications for acquisition window duration for MR flow quantification," Journal of Magnetic Resonance Imaging, Society for Magnetic Resonance Imaging, Oak Brook, IL, U.S., vol. 8, Jan. 1, 1998, pp. 568-576, XP002416396, ISSN: 1053-1807.

Weber et al., "Whole-Heart Steady-State Free Precession Coronary Artery Magnetic Resonance Angiography," Magnetic Resonance in Medicine 50, pp. 1223-1228 (2003).

Office Action mailed on Sep. 11, 2012 in JP 2007-327683 with English translation.

Office Action mailed on Jan. 29, 2013 in JP 2007-327683 with English translation.

* cited by examiner

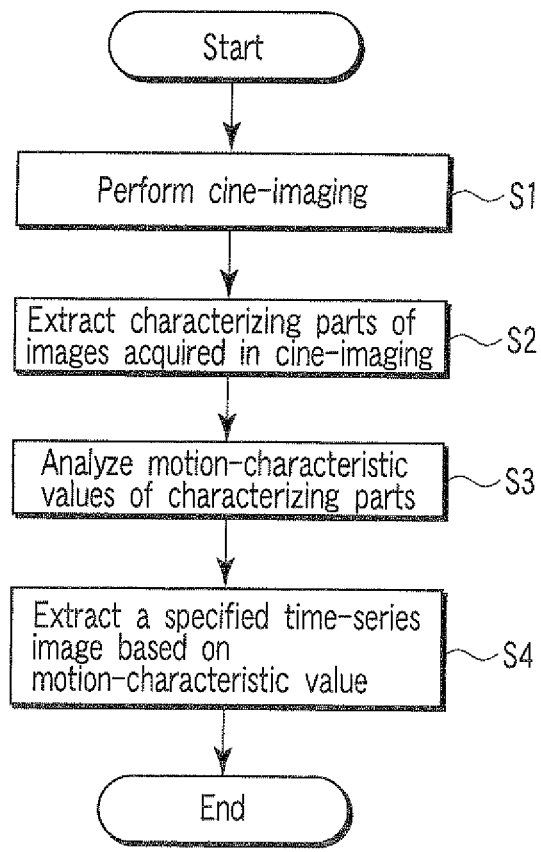
F I G. 3

F I G. 4A
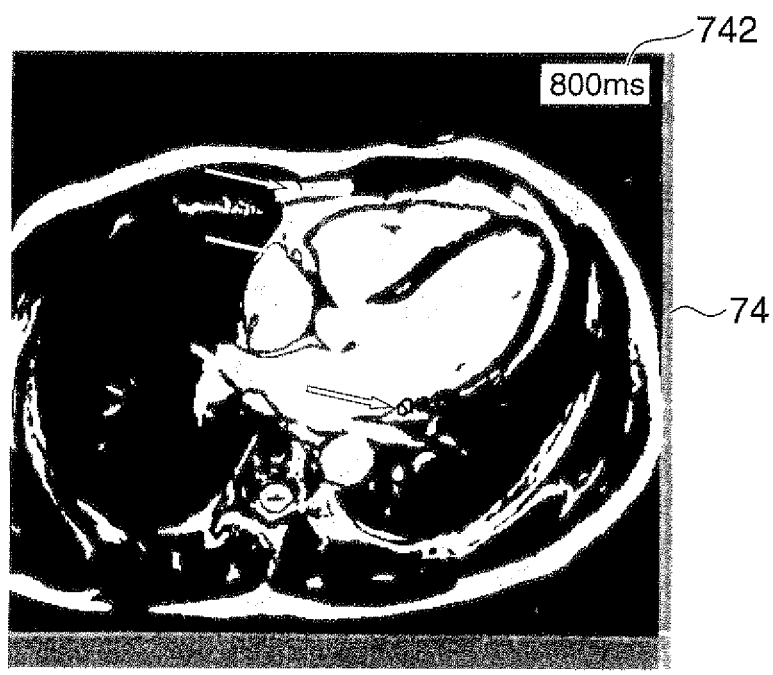
F I G. 4B

MAGNETIC RESONANCE IMAGING APPARATUS AND METHOD OF ANALYZING IMAGES PROVIDED THEREBY

CROSS-REFERENCE TO RELATED APPLICATIONS

This application is based upon and claims the benefit of priority from prior Japanese Patent Applications No. 2007-027050, filed Feb. 6, 2007; and No. 2007-327683, filed Dec. 19, 2007, the entire contents of both of which are incorporated herein by reference.

BACKGROUND

1. Technical Field

The present invention relates to a magnetic resonance imaging apparatus for use in medical diagnosis systems. The invention also relates to a method of analyzing images provided by the imaging apparatus. More particularly, the invention is applied to a magnetic resonance imaging apparatus that is used to provide images of the coronary arteries.

2. Description of the Related Art

In recent years, image diagnosis apparatuses have advanced so much that the patient's heart can now be examined at the clinic site. In magnetic resonance imaging (MRI), for example, cine-scan, delayed enhancement imaging, stress myocardial perfusion imaging, and the like can now be performed. Although image diagnosis apparatuses have so advanced, the imaging of the coronary arteries cannot be so successfully achieved as desired. The images of the coronary arteries obtained are not as high in quality or stability as desired. This is not only because the coronary arteries are thin and run in a complex manner, but also because the heart moves in a complex way, too, and in a different manner from patient to patient. Hence, the coronary arteries must be imaged at high spatial resolution and high time resolution. To provide high-quality images of the coronary arteries, high skills are required in positioning the patient, setting various imaging conditions and inducing non-uniformity of the magnetic field.

Recently, methods of covering the entire heart in coronary artery MRI, using the balanced steady-state free precession (SSFP) sequence and respiratory navigator tracking, have been reported in, for example, Weber et al., Magnetic Resonance in Medicine, 50, 1223 1228, 2003, and Sakuma et al., Eizo joho MEDICAL, Vol. 36, No. 10.

In these methods, segmentation is performed, and the time of acquiring data for one heartbeat in ECG gating mode is as short as about 100 ms. The data-acquisition period must therefore be synchronized with the cardiac phase. Hitherto, to determine a cardiac phase in which the coronary arteries remains at rest, cardial cine scan should be performed before the coronary artery scan and the resulting cine images are carefully observed. It is important to observe both the image of the right coronary artery and the image of the left coronary artery.

In most cases, the right coronary artery and the left coronary artery differ in static phase and also in the duration of static phase. The operator therefore needs to observe the cine images very carefully. Thus, much time is required before imaging the coronary arteries. This is one of the factors that decrease examination throughput. The longer the examination lasts, the more tired the patient will be. Consequently, the cardiograph and respiration patterns become unstable, inevitably degrading image quality.

BRIEF SUMMARY

Accordingly, an object of the present exemplary embodiments is to provide a magnetic resonance imaging apparatus that can easily and accurately determine the phase in which the coronary arteries do not move or scarcely move, and also a method of analyzing the images provided by the magnetic resonance imaging apparatus.

A magnetic resonance imaging apparatus according to the present exemplary embodiments is configured to generate a static magnetic field, to superpose, on the static magnetic field, a gradient magnetic field generated by a gradient magnetic-field coil, to detect a magnetic resonance signal generated in a subject lying in the static magnetic field and induced from a high-frequency magnetic field emanating from a transmitting coil, and to acquire an image from the magnetic resonance signal. The apparatus comprises: a cine-imaging unit which collects time-series images of a region of interest in the subject and which reconstructs an image; a characterizing-part detecting unit which detects characteristics of the time-series images; a motion-analyzing unit which analyzes motion-characteristic values of the characteristics detected by the characterizing-part detecting unit; and an image-extracting unit which extracts a specified time-series image in accordance with the motion-characteristic values.

The present exemplary embodiments also relate to a magnetic resonance imaging apparatus that comprises a pulse-applying unit which applies a gradient magnetic field and high-frequency pulses to a subject lying in a static magnetic field; a cine-image unit which collects time-series images of a region of interest in the subject and which reconstructs an image from a magnetic resonance signal generated in a subject as the gradient magnetic field and high-frequency pulses are applied to the subject; a characterizing-part detecting unit which detects characteristics of the time-series images; a motion-analyzing unit which analyzes motion characteristic values of the characteristics detected by the characterizing-part detecting unit; and an information-extracting unit which extracts information about a specified time phase, on the basis of the motion-characteristic values.

The present exemplary embodiments also relate to a method of analyzing images, according to the present invention, is designed in combination with a magnetic resonance imaging apparatus configured to generate a static magnetic field, to superpose, on the static magnetic field, a gradient magnetic field generated by a gradient magnetic-field coil, to detect a magnetic resonance signal generated in a subject lying in the static magnetic field and induced from a high-frequency magnetic field emanating from a transmitting coil, and to acquire an image from the magnetic resonance signal. The method comprises: collecting time-series images of a region of interest in the subject and reconstructing an image; detecting characteristics of the time-series images; analyzing motion-characteristic values of the characteristics extracted; and extracting a specified time-phase image in accordance with the motion-characteristic values.

Additional objects and advantages of the exemplary embodiments will be set forth in the description which follows, and in part will be obvious from the description, or may be learned by practice of the exemplary embodiments. The objects and advantages of the exemplary embodiments may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 3 is a flowchart explaining how the MRI apparatus according to the first embodiment of the invention operates;

FIG. 4A is diagram showing an original cine-image of the heart;

FIG. 4B is a diagram showing a binary image of the heart;

DETAILED DESCRIPTION OF EXEMPLARY EMBODIMENTS

Embodiments of the present invention will be described, with reference to the accompanying drawings.

(First Embodiment)

Figure 1A:
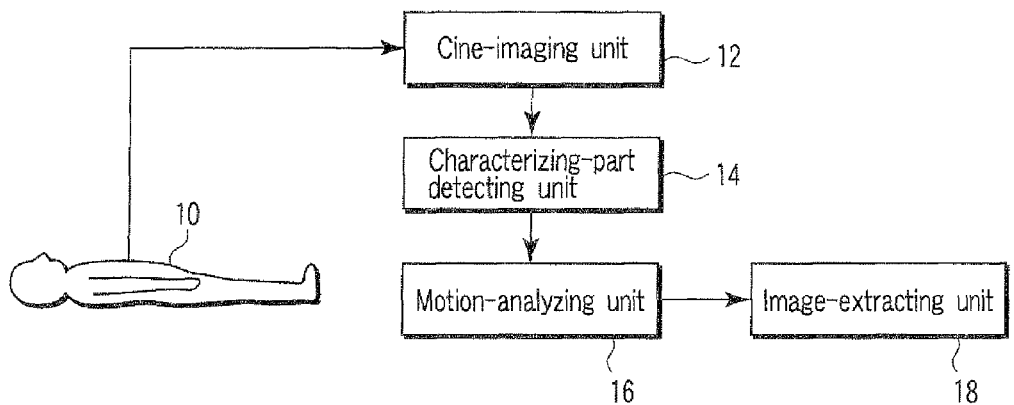
FIG. 1A is a block diagram showing the basic configuration of a magnetic resonance imaging apparatus according to a first embodiment of this invention.

FIG. 1A is a block diagram showing the basic configuration of a magnetic resonance imaging apparatus (hereinafter referred to as MRI apparatus) according to a first embodiment of this invention.

As FIG. 1A shows, the MRI apparatus comprises a cine-imaging unit 12, a characterizing-part detecting unit 14, a motion-analyzing unit 16, and an image-extracting unit 18. The cine-imaging unit 12 collects time-series images of a region of interest (subject 10) in order to reconstruct an image. The characterizing-part detecting unit 14 detects characteristics of the time-series images. The motion-analyzing unit 16 analyzes the motion-characteristic values of the characteristics. The image-extracting unit 18 extracts specified time-series image in accordance with the motion-characteristic values.

In the MRI apparatus thus configured, the cine-imaging unit 12 collects time-series images from the subject 10 in order to reconstruct an image. The characterizing-part detecting unit 14 detects the characteristics of the time-series images collected by the cine-imaging unit 12, for example the characteristics of the heart of the subject 10. The motion-analyzing unit 16 finds the motions and characteristics of the specified parts of the heart, as motion-characteristic values. The image-extracting unit 18 extracts specified time-series image in accordance with the motion-characteristic values.

Figure 2:
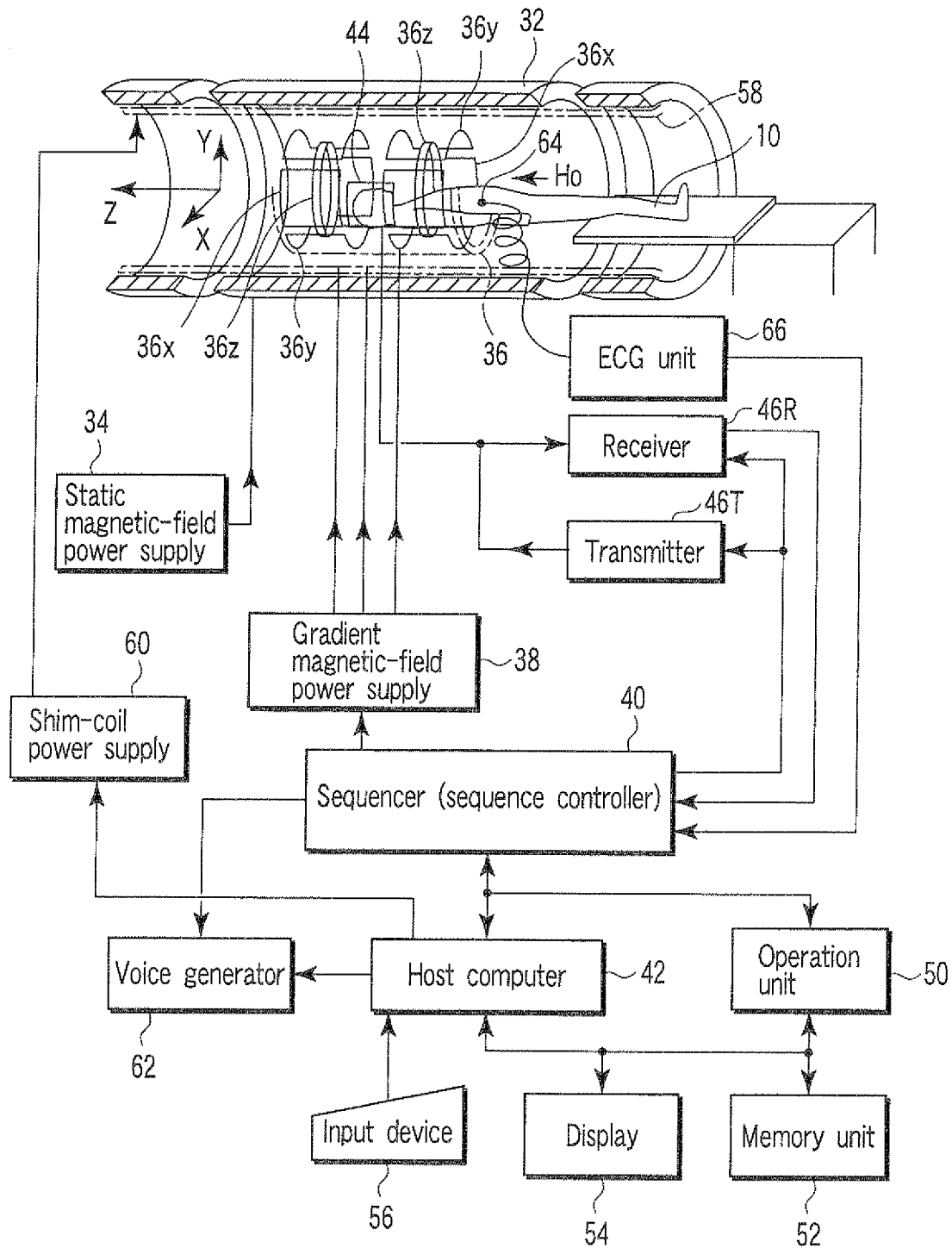
FIG. 2 is a block diagram showing the configuration of the magnetic resonance imaging apparatus according to the first embodiment of the present invention.

FIG. 2 is a block diagram showing the configuration of the MRI apparatus according to the first embodiment of the present invention.

The MRI apparatus 30 comprises a bed unit, a static magnetic-field generating unit, a gradient magnetic-field generating unit, a transmitter/receiver unit, a control/operation unit, an electrocardiograph unit, and a breath-hold instructing unit. The bed unit is designed to hold the subject 10. The static magnetic-field generating unit generates a static magnetic field. The gradient magnetic-field generating unit generates a gradient magnetic field that applies position data to the static magnetic field. The transmitter/receiver unit controls the other components of the MRI apparatus 30 so that an image may be reconstructed. The electrocardiograph unit evaluates ECG signals that represent the cardiac phase of the subject 10. The breath-hold instructing unit generates breath-hold instructions.

The static magnetic-field generating unit includes a magnet (static magnetic-field magnet) 32 and a static magnetic-field power supply 34. The magnet 32 is, for example, a superconductive magnet. The static magnetic-field power supply 34 supplies a current to the magnet 32. The static magnetic-field generating unit generates a static magnetic field $H_0$ that extends axially (along the Z-axis) of a cylindrical hollow (diagnosis space), in which the subject 10 may be inserted. A shim coil 58 is provided on the magnet 32. The shim coil 58 receives a current supplied from a shim-coil power supply 60 under the control of a host computer 42, which will be described later. This current makes the static magnetic field uniform. The bet unit has a top plate, which may hold the subject 10 and which can be inserted into, and drawn from, the cylindrical hollow.

The gradient magnetic-field generating unit includes a gradient magnetic-field coil unit 36. The gradient magnetic-field generating unit 36 has three coils 36x, 36y and 36z. These coils 36x, 36y and 36z generate three gradient magnetic fields that extend along the X-, Y- and Z-axes that intersect with one another. The gradient magnetic-field generating unit includes a gradient magnetic-field power supply 38 that supplies currents to the coils 36x, 36y and 36z. The gradient magnetic-field power supply 38 supplies pulse currents to the coils 36x, 36y and 36z under the control of a sequencer 40, which will be described later. The coils 36x, 36y and 36z generate gradient magnetic fields from the pulse currents.

The pulse currents to be supplied from the gradient magnetic-field power supply 38 to the coils 36x, 36y and 36z can be adjusted, thereby to generate gradient magnetic fields that extend along the X-, Y- and Z-axes, which are physical axes. These gradient magnetic fields can be synthesized to set the logic axis of a slice-direction gradient magnetic field Gs, the logic axis of a phase-encode-direction gradient magnetic field Ge and the logic axis of a read-direction (frequency-encode direction) gradient magnetic field Gr. The gradient magnetic fields in the slice direction, phase-encode direction and read direction are superposed on the static magnetic field $H_0$.

The transmitter/receiver unit includes an RF coil 44, a transmitter 46T, and a receiver 46R. The RF coil 44 is arranged near the subject 10 lying in the imaging space of the magnet 32. The transmitter 46T and receiver 46R are connected to the RF coil 44. The transmitter 46T and receiver 46R operate under the control of the sequencer 40, which will be described later. The transmitter 46T supplies RE pulses of Lamor frequency to the RE coil 44 in order to induce nuclear magnetic resonance. The receiver 46R receives the echo signal (high-frequency signal) that the RF coil 44 has received, and performs various processes, such as pre-amplification, intermediate-frequency conversion, phase detection, low-frequency amplification and filtering, on the echo signal, thereby converting the echo signal to eco data (original data) that corresponds to the echo signal.

The control/operation unit includes a sequencer (also known as sequence controller) 40, a host computer 42, an operation unit 50, a memory unit 52, a display 54, an input device 56, and a voice generator 62. The host computer 42 contains software, and can give pulse-sequence information to the sequencer 40 in the sequence described in the software. The host computer 42 can also controls any other components of the MRI apparatus 30.

The host computer 42 performs a positioning scan and then an imaging scan. The imaging scan is a process for acquiring echo data items indispensable in reconstructing an image. The imaging scan is the two-dimensional scan in the present embodiment. The imaging scan can be accomplished, along with the ECG gating method using ECG signals. Note that the ECG gating method need not be performed in some cases.

The sequencer 40 comprises a CPU (not shown) and a memory (not shown). The sequencer 40 therefore stores the pulse-sequence information supplied from the host computer 42. In accordance with the pulse-sequence information, the sequencer 40 controls the gradient magnetic-field power supply 38, transmitter 46T and receiver 46R, receives, temporarily stores the echo data output from the receiver 46R and transfers the echo data to the operation unit 50. The pulse-sequence information is the very information that drives the gradient magnetic-field power supply 38, transmitter 46T and receiver 46R in accordance with a pulse sequence. The pulse-sequence information contains, for example, data items representing the magnitudes of the pulse currents to be supplied to the coils 36x, 36y and 36z, the periods for which these currents should be supplied to the coils 36x, 36y and 36z and the timing of supplying these currents thereto.

The operation unit 50 receives the echo data items from the receiver 46R via the sequencer 40. The echo data items are stored into a memory, which the operation unit 50 incorporates and which has a Fourier space (also known as k space or frequency space). The operation unit 50 subjects the echo data items to two- or three-dimensional Fourier transform, reconstructing real-space image data.

The memory unit 52 can store not only the image data thus reconstructed, but also the image data that has undergone the aforementioned synthesis or differential process. The display 54 can display images under the control of the host computer 42. The operator may operate the input device 56 to input desirable imaging conditions, a pulse sequence and information about image synthesis and differential process to the host computer 42.

In the MRI apparatus 30, the control/operation unit includes the voice generator 62 as described above. The voice generator 62 functions as an element of the breath-hold instructing unit. Upon receiving a breath-hold instruction from the breath-hold instructing unit, the voice generator 62 generates an audio message telling the subject 10 to start or stop holding breath.

The electrocardiograph unit includes an ECG sensor 64 and an ECG unit 66. The ECG sensor 64 may be attached to the subject 10 to detect an ECG signal, which is an electric signal, from the subject 10. The ECG sensor 66 performs various processes, including binary encoding, on the ECG signal detected by the ECG sensor 64, thus generating a digital signal. The digital signal is output to the host computer 42 and the sequencer 40. The sequencer 40 uses the signal generated by the sequencer 40 in order to perform an imaging scan. An appropriate gated timing can thereby be set by the ECG gating method (cardio-gating method). At this gated timing, the imaging scan is accomplished, collecting data.

How the MRI apparatus 30 so configured as described above operates will be explained with reference to the flowchart of FIG. 3.

When the sequence is started, the cine-imaging unit 12 performs cine-imaging in Step S1, collecting the time-series images of the subject and reconstructing an image. In the MRI apparatus 30, for example, the cine-imaging is carried out as follows. That is, the magnet 32 magnetizes the nuclear magnetic spins in the subject, whereby an RF-transmitting coil applies an RF magnetic field. The RF magnetic field induces nuclear magnetic resonance, which generates a resonance signal. The resonance signal is detected by an RF-receiving coil.

To achieve the imaging, or to add spatial data to the received signal, the gradient magnetic-field generating unit 36 is driven in at the RF-transmitting timing and the RF-receiving timing. A gradient magnetic field is thereby generated in the static magnetic-field magnet 32. The host computer 42 generates control data instructing that an RF magnetic field and a gradient magnetic field should be applied and received at a predetermined timing. This control data is supplied to the sequencer 40.

The received signal, to which the spatial data has been added, is supplied to the operation unit 50 (i.e., image-reconstructing device). The operation unit 50 reconstructs an image. To accomplish the cine-imaging, the same cross section of the subject is repeatedly photographed, providing time-series images. In order to achieve the cine-imaging of an organ that greatly moves, such as the heart, k space data of each slice is divided into several segments and each segment is acquired repeatedly in time sequence. Cine-image data containing time-series information is thereby acquired.

Assume that an image of the coronary arteries of the heart is provided. The cine-imaged cross section of the heart may be, as in many cases, a view (e.g., four-chamber view) in which both the left and right coronary arteries can be depicted. In the cine-imaging, the balanced SSFP sequence is often used as pulse sequence. The signals pertaining to the coronary arteries and the fat are at high level, whereas the signals pertaining to the boundary between each coronary artery and the fat are at low level.

In a four-chamber view, the coronary arteries run perpendicular to the plane of the view. Therefore, in the time-series images, the right coronary artery looks like a black-rimmed circle. The image of the left coronary artery is black-rimmed, too, in most cases, but may not be a circle. Either coronary artery is visualized in a high-level signal region that is rimmed with a low-signal region.

In Step S2, characteristics are extracted from each of the time-series images acquired in Step S1. In case of coronary artery imaging, the arteries themselves have good characteristics, because they are visualized in a rimmed region. In the ECG unit 66 and the sequencer 40, the levels of the signals representing the time-series images are binary-coded, providing binary image data items. From the binary image data items, small closed loops are extracted. Time-series images of the heart are encoded into binary data items, a plurality of small closed loops will be generated. The closed loops resulting from the coronary arteries should therefore be reliably detected.

There are two methods of detecting the closed loops. The first method is determine that any closed loop having a size equal to or smaller than an upper limit has resulted from either coronary artery. Such a closed loop can be detected, because it cannot be other than a blood vessel if the region of interest is the heart. The second method is to determine that any closed loop existing in a designated region where the coronary arteries exist has resulted from either coronary artery. The region may be automatically designated in the apparatus or may be designated by the operator. Further, these methods can be employed in combination. In this case, the coronary arteries can be detected at a higher precision.

The characteristics to be detected are not limited to the coronary arteries. Any other parts may be extracted so long as they characterize the image.

FIGS. 4A and 4B show an example of a cine-image of the heart. More precisely, FIG. 4A shows an original cine-image of the heart, and FIG. 4B shows a binary image of the heart. In FIG. 4B, the white dots pointed by arrows are the coronary arteries.

In Step S3, the motion-characteristic values of the characteristics detected are analyzed. First, the center of gravity in the image of each characteristic detected is determined. The centers of gravity, thus determined for all time-series images, respectively, are given as follows:

($X_i$, $Y_i$)(i=1,2, . . . , N, where $N$ is the number of the time-series images)

Then, the motion-characteristic values $P_i$ are defined as follows:

$$P_i = \sqrt{\{(X_i - X_{i-1})^2 + (Y_i - Y_{i-1})^2\}}$$

(i=1, 2, . . . , N−1)

$P_i$ is a quantity that indicates how much the center of gravity deviates from one frame (time-series image) to another. The more the center of gravity deviates in each characteristic, the greater the value of $P_i$. The less the center of gravity deviates, the smaller the value of $P_i$ will be.

Figure 5:
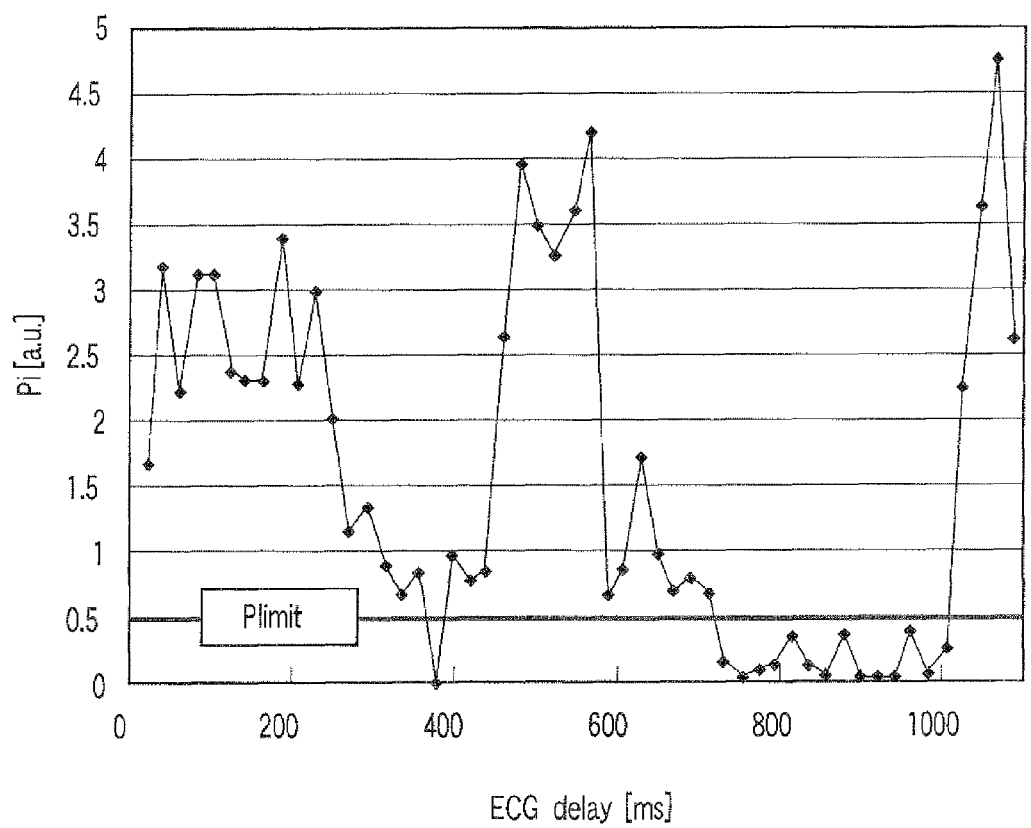
FIG. 5 is a graph representing how the motion-characteristic value $P_i$ of the right coronary artery changes with time.

FIG. 5 is a graph representing the motion characteristic value $P_i$, calculated for the right coronary artery.

As seen from FIG. 5, $P_i$ is in quantitatively static phase, though the heart moves a little in the latter half of the expanding phase. The motion-characteristic value may be defined in another way, for example, as in the following equation:

$$Q_{i,k} = \sqrt{\{(X_i - X_k)^2 + (Y_i - Y_k)^2\}}$$

(i=1, 2, . . . , N−1; 1≦k≦N)

where $Q_{i,k}$ is a deviation from the kth time-series image used as reference.

Besides the two definitions given above, the motion-characteristic value can be defined by utilizing a mutual function.

Finally, in Step S4, a specified time-series image is extracted in accordance with the motion-characteristic value. For an image of the coronary arteries of the heart, it is important to detect a time phase in which the coronary arteries scarcely move. Thus, it suffices to select the i-th image whose motion characteristic value $P_i$, is equal to or less than $P_{limit}$ that is almost zero. $P_{limit}$, which is a tolerated motion value, may be set as a threshold for the image-extracting unit 18. It can be designated by the operator. The image extracted is displayed by the display 54 that is configured to display time-series images, or the information identifying the image extracted is added to information about the image. This makes it easy for the operator to understand the results of the image-extraction.

Two modifications of the first embodiment of the present invention will be described.

It is advantageous to alter the method of extracting an image in accordance with the motion-characteristic value, as in the first modified embodiment described below.

The first modified embodiment is designed for the case where images, which have been extracted by determining the value $P_i$, with respect to $P_{limit}$, are discrete along the time axis. In this case, any images, which are interposed between the images extracted and would not otherwise be extracted, will be extracted. Alternatively, any image, which is interposed between the images extracted and is not otherwise extracted will be extracted if its value $P_i$ satisfies the following:

$$P_i < (1+\alpha) P_{limit} \ (\alpha \text{ is a small positive value})$$

The images that have not otherwise been extracted due to calculation errors can therefore be extracted. That is, consecutive images with similar motion characteristics can be stably extracted.

The second modified embodiment of this invention will be described.

In the second modified embodiment, the characterizing-part detecting unit 14 detects a plurality of characteristics. In an image of the coronary arteries of the heart, for example, the right and left coronary arteries are detected as characteristics, and the motion-characteristic values $R_i$ are given by the following equation:

$$R_i = (\Pi_j \sqrt{\{(Xj\, i - Xj\, i-1)2 + (Yj\, i - Yj\, i-1)2\}}) 1/M$$

where i=1, 2, . . . , N−1, N being the number of time-series images, j=1, 2, . . . , M, M being the number of characteristics detected, and j of Πj is the product of 1, 2, . . . , and M.

Using the characteristic values $R_i$, the image-extracting unit 18 can extract an image in which a plurality of characteristics appear to be stationary. The above definition of $R_i$, is suitable to extract the image in which almost all parts, appear to be stationary. The images with different motion patterns can be extracted, by modifying the definition of $R_i$.

As has been described above, the present embodiment can extract those of the time-series images, which are similar in motion characteristics. In providing an image of, for example, the coronary arteries of the heart, the time phase in which the coronary arteries scarcely move can be quickly determined. This can help to enhance the image of coronary arteries in terms of quality.

In the first embodiment described above, the coronary arteries of the heart are imaged in a time phase where the coronary arteries scarcely move. The time phase in which the arteries are imaged is not limited to one, however. The coronary arteries may be imaged in, for example, two time phases within a certain period.

(Second Embodiment)

A second embodiment of the present invention will be described.

Figure 1B:
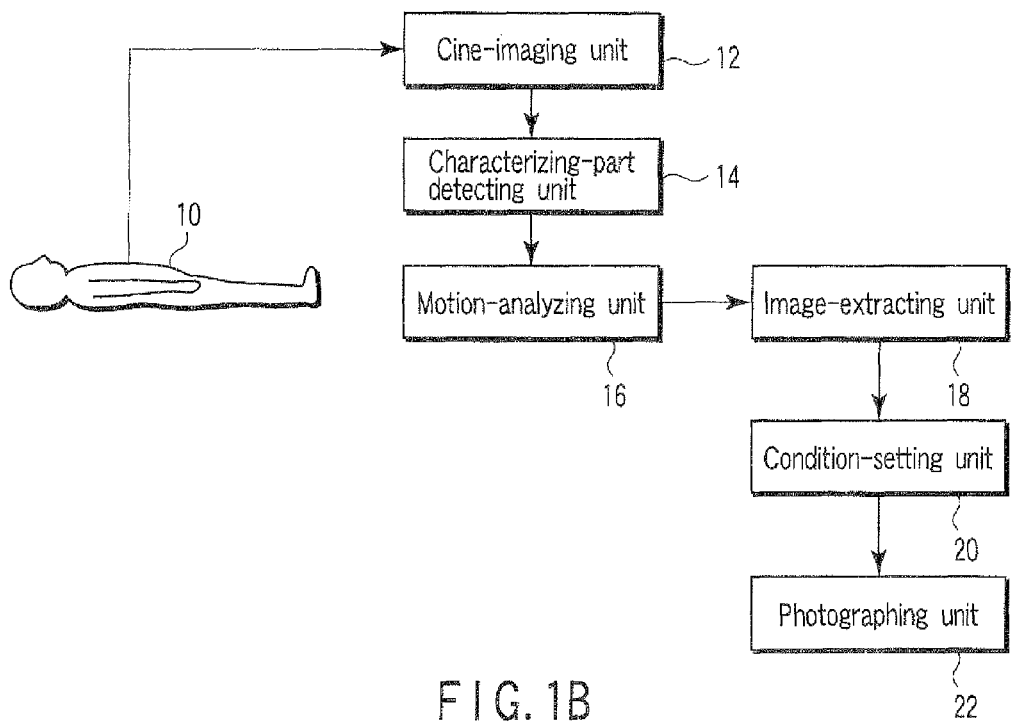
FIG. 1B is a block diagram showing the basic configuration of a magnetic resonance imaging apparatus according to a second embodiment of this invention.

FIG. 1B is a block diagram showing the basic configuration of a magnetic resonance imaging (MRI) apparatus according to the second embodiment of this invention.

The MRI apparatus according to the second embodiment operates basically in the same way, and has the same basic configuration, as the MRI apparatus according to the first embodiment. Therefore, the components identical to those of the first embodiment are designated by the same reference numerals and will not be described. Only the components different from those of the first embodiment will be described.

As FIG. 1B shows, this MRI apparatus comprises a cine-imaging unit 12, a characterizing-part detecting unit 14, a motion-analyzing unit 16, an image-extracting unit 18, a condition-setting unit 20, and a scanning unit 22. The condition-setting unit 20 is configured to set gated scanning and other conditions of scanning the coronary arteries, in connection with a specified time-series image extracted by the image-extracting unit 18. The scanning unit 22 performs scanning in the conditions set by operating the condition-setting unit 20.

In the MRI apparatus thus configured, the cine-imaging unit 12 collects time-series images from the subject 10 in order to reconstruct an image. The characterizing-part detecting unit 14 detects the characteristics of the time-series images collected by the cine-imaging unit 12, for example the characteristics of the heart of the subject 10. The motion-analyzing unit 16 finds the motions and characteristics of the specified parts of the heart, as motion-characteristic values. The image-extracting unit 18 extracts specified time-series image in accordance with the motion-characteristic values.

On the basis of the specified time-series image and the information associated with this image, both extracted by the image-extracting unit 18, the condition-setting unit 20 sets gated scanning and other conditions of scanning the coronary arteries. The MRI system performs scanning in the conditions set by operating the condition-setting unit 20, providing images of the heart in desirable time phases.

Figure 6:
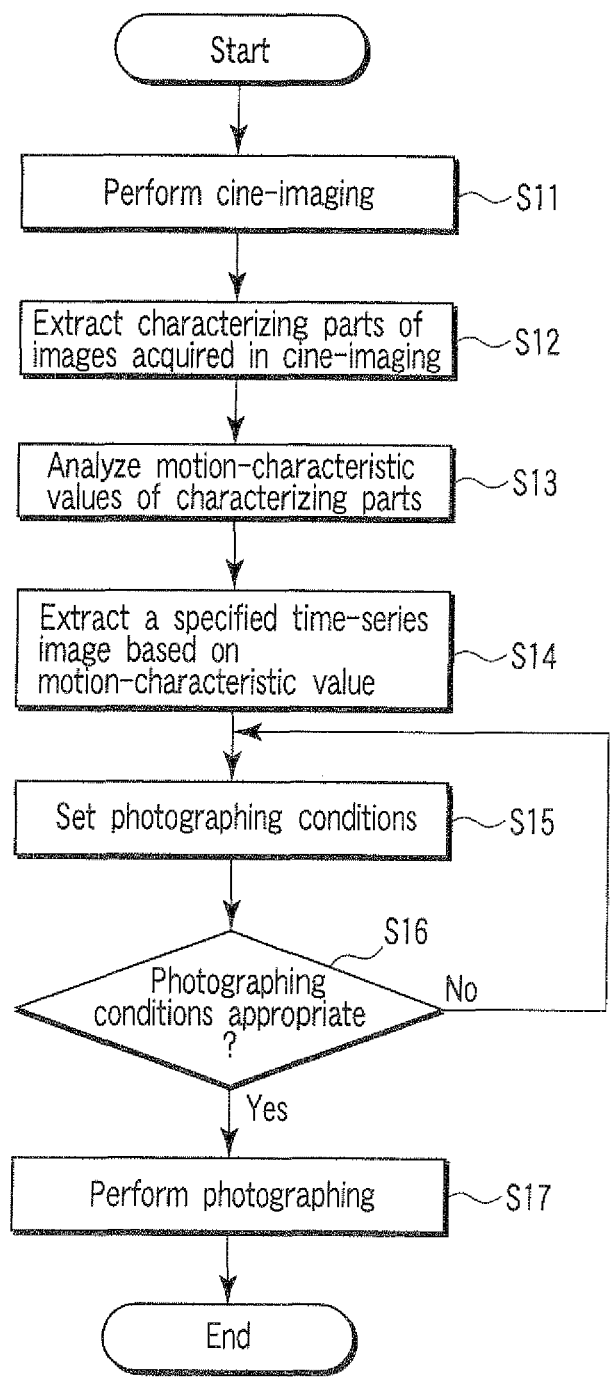
FIG. 6 is a flowchart explaining the operation of an MRI apparatus according to the second embodiment of the present invention.

How the MRI apparatus according to the first embodiment operates will be explained with reference to the flowchart of FIG. 6.

Steps S11 to S14 shown in this flowchart are identical to Step S1 to S4 shown in the flowchart of FIG. 3. Therefore, Steps S11 to S14 will not be described here.

In Step S14, a specified time-series image is extracted in accordance with the motion-characteristic value. Then, in Step S15, the condition-setting unit 20 sets gated scanning and other conditions of scanning the coronary arteries. The operator inputs, for example, delay time (800 ms) shown in FIG. 4B, as associated information 742 displayed in image 74 shown in FIG. 4B. Alternatively, the operator may set the scanning conditions, using the number of white dots (i.e., images of the coronary arteries) displayed in the image 74, as the information identifying the image extracted.

Then, in Step S17, the scanning unit 22 performs scanning in the cardiac phase of the subject, in the scanning conditions set in Step S16. The scanning performed in Step S17 may use the above-mentioned SSFP sequence, or may be the spin echo (SE) method or the echo planar imaging (EPI) method.

The scanning conditions may be set in Step S15 on the basis of such a characteristic diagram as shown in FIG. 5. Further, the characteristic diagram of FIG. 5 may be displayed, together along with the image 74, at the same time.

In the embodiments described above, the characteristics of the region of interest in the subject are detected. Instead, characteristics may be extracted from the original image data, if the amount of data involved does not exceed the tolerance value.

In the embodiments described above, a cine-image of the region of interest is acquired, then the characteristics of the cine-image are detected, and an image is extracted in accordance with the motion-characteristic value. Instead, the similarity (characteristics) the image has with respect to a sample image may be detected.

Embodiments of the present invention have been described. Nonetheless, this invention is not limited to the embodiment. Various changes and modifications can be made, without departing the scope and spirit of the present invention.

Further, the embodiments described above include various phases of the invention. The components disclosed herein may be combined in various ways to make various inventions. Even if some components of any embodiment described above are not used, it is possible to solve the problems specified above. Any configuration not using some components can be considered as an example of the invention so long as it achieves at least one of the advantages that will be stated in the following paragraph.

A magnetic resonance imaging apparatus is provided that can easily and accurately determine the period in which the coronary arteries do not move or scarcely move, a method of analyzing the images provided by the magnetic resonance imaging apparatus, and a program for analyzing the images.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of determining static time phase of a coronary artery of a subject's beating heart using a magnetic resonance imaging (MRI) apparatus configured to generate a static magnetic field and a superimposed gradient magnetic field, to detect a plurality of magnetic resonance signals generated in the subject lying in the static magnetic field and induced by a radio-frequency magnetic field emanating from a transmitting coil, and to reconstruct an image from the plurality of magnetic resonance signals, the method further comprising:
    using said MRI apparatus to collect a time-series of N cine images of the coronary artery of the subject's heart, wherein an MRI data acquisition pulse sequence and imaged cross-section of the cine images cause the coronary artery to be visualized in the cine images as a high-level signal region that is rimmed with a closed loop low-signal region;
    encoding each image of the time-series of N cine images into a binary image;
    detecting in each of the binary images the closed loop of the coronary artery;
    determining a center of gravity of the closed loop for each image of the time-series of cine images on the basis of the detected closed loop;
    for N−1 images of the time series of N cine images, calculating motion-characteristic values indicating how much positions of the centers of gravity in the N−1 images deviate from the position of the center of gravity in another image of the time-series of N cine images; and
    extracting a specific time-series image whose motion-characteristic value is equal to or below a threshold.

2. The method according to claim 1, further comprising displaying the extracted time-series image.

3. A magnetic resonance imaging apparatus for coronary artery imaging adapted to carry out the method of claim 1.

4. The method according to claim 1, wherein the closed loop is identified as a closed loop resulting from the coronary artery when the size of the closed loop is smaller than a preset size.

5. The magnetic resonance imaging apparatus according to claim 3, further comprising:
    a condition-setting unit adapted to set gated scanning and other conditions for scanning the coronary arteries on the basis of the specific time phase of the extracted specific time-series image, and
    a scanning unit adapted to perform scanning in accordance with the scanning conditions set by the condition-setting unit.

6. The method according to claim 2, wherein the closed loop is identified as a closed loop resulting from the coronary artery when the size of the closed loop is smaller than a preset size.

* * * * *